United States Patent
Jang et al.

(10) Patent No.: US 9,598,634 B2
(45) Date of Patent: *Mar. 21, 2017

(54) METHOD FOR PREPARING MULTILAYER OF NANOCRYSTALS, AND ORGANIC-INORGANIC HYBRID ELECTROLUMINESCENCE DEVICE COMPRISING MULTILAYER OF NANOCRYSTALS PREPARED BY THE METHOD

(75) Inventors: Eun Joo Jang, Daejeon-Si (KR); Shin Ae Jun, Seongnam-Si (KR); Sung Hun Lee, Yongin-Si (KR); Jong Jin Park, Guri-Si (KR); Seong Jae Choi, Seoul (KR); Tae Kyung Ahn, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 967 days.

This patent is subject to a terminal disclaimer.

(21) Appl. No.: 13/492,327

(22) Filed: Jun. 8, 2012

(65) Prior Publication Data

US 2012/0267616 A1 Oct. 25, 2012

Related U.S. Application Data

(60) Continuation-in-part of application No. 13/475,610, filed on May 18, 2012, now Pat. No. 8,440,254, (Continued)

(30) Foreign Application Priority Data

May 28, 2004 (KR) .................................. 2004-38391

(51) Int. Cl.
*C09K 11/02* (2006.01)
*B82Y 20/00* (2011.01)
(Continued)

(52) U.S. Cl.
CPC ............ *C09K 11/025* (2013.01); *B82Y 20/00* (2013.01); *B82Y 30/00* (2013.01); *C09K 11/565* (2013.01);
(Continued)

(58) Field of Classification Search
CPC .......... H01L 29/66462; H01L 29/7787; H01L 29/2003; H01L 51/5012; C09K 11/025;
(Continued)

(56) References Cited

U.S. PATENT DOCUMENTS 5,178,959 A * 1/1993 Eckberg et al. .............. 428/447
5,537,000 A 7/1996 Alivisatos
(Continued)

FOREIGN PATENT DOCUMENTS

JP 58-062838 A * 4/1983
JP H06349579 A 12/1994
(Continued)

OTHER PUBLICATIONS

Collins English Dictionary—Complete and Unabridged © HarperCollins Publishers 1991, 1994, 1998, 2000, 2003.*
Office Action—U.S. Appl. No. 13/475,610 dated Aug. 24, 2012.

*Primary Examiner* — John P Dulka
*Assistant Examiner* — Charles R Peters
(74) *Attorney, Agent, or Firm* — Cantor Colburn LLP (57) ABSTRACT

Disclosed herein is a method for preparing a multilayer of nanocrystals. The method comprises the steps of (i) coating nanocrystals surface-coordinated by a photosensitive compound, or a mixed solution of a photosensitive compound and nanocrystals surface-coordinated by a material miscible with the photosensitive compound, on a substrate, drying the coated substrate, and exposing the dried substrate to UV light to form a first monolayer of nanocrystals, and (ii) repeating the procedure of step (i) to form one or more
(Continued)

monolayers of nanocrystals on the first monolayer of nanocrystals.

14 Claims, 6 Drawing Sheets

Related U.S. Application Data which is a division of application No. 12/432,180, filed on Apr. 29, 2009, now Pat. No. 8,188,650, which is a division of application No. 11/002,461, filed on Dec. 3, 2004, now Pat. No. 7,569,248.

(51) Int. Cl.
| | |
|---|---|
| *B82Y 30/00* | (2011.01) |
| *C09K 11/56* | (2006.01) |
| *C09K 11/62* | (2006.01) |
| *C09K 11/64* | (2006.01) |
| *C09K 11/66* | (2006.01) |
| *C09K 11/70* | (2006.01) |
| *C09K 11/74* | (2006.01) |
| *C09K 11/88* | (2006.01) |
| *C09K 11/89* | (2006.01) |
| *H01L 51/50* | (2006.01) |
| *H05B 33/14* | (2006.01) |

(52) U.S. Cl.
CPC ............ *C09K 11/62* (2013.01); *C09K 11/621* (2013.01); *C09K 11/64* (2013.01); *C09K 11/661* (2013.01); *C09K 11/70* (2013.01); *C09K 11/7492* (2013.01); *C09K 11/88* (2013.01); *C09K 11/883* (2013.01); *C09K 11/892* (2013.01); *H01L 51/504* (2013.01); *H01L 51/5012* (2013.01); *H05B 33/14* (2013.01)

(58) Field of Classification Search
CPC ....... C09K 11/62; C09K 11/70; C09K 11/621; C09K 11/88; C09K 11/7492; C09K 11/883; C09K 11/892; C09K 11/565; C09K 11/661; H05B 33/14; B82Y 30/00; B82Y 20/00
See application file for complete search history.

(56) References Cited

U.S. PATENT DOCUMENTS

| | | | |
|---|---|---|---|
| 5,751,018 | A | 5/1998 | Alivisatos |
| 6,049,090 | A | 4/2000 | Clark |
| 6,159,620 | A | 12/2000 | Heath |
| 6,259,506 | B1 | 7/2001 | Lawandy |
| 6,608,439 | B1 | 8/2003 | Sokolik |
| 6,773,946 | B2 | 8/2004 | Moon et al. |
| 6,805,904 | B2 | 10/2004 | Anders et al. |
| 7,081,664 | B2 | 7/2006 | Hill |
| 7,199,393 | B2 | 4/2007 | Park |
| 7,569,248 | B2 * | 8/2009 | Jang ...................... B82Y 20/00 313/506 |
| 8,188,650 | B2 | 5/2012 | Jang et al. |
| 8,338,512 | B2 | 12/2012 | Hsu |
| 8,455,865 | B2 | 6/2013 | Hsu |
| 2003/0059647 | A1 | 3/2003 | Thompson et al. |
| 2003/0157325 | A1* | 8/2003 | Anders et al. ................ 428/402 |
| 2004/0067450 | A1* | 4/2004 | Leatherdale et al. ......... 430/322 |
| 2004/0214362 | A1 | 10/2004 | Hill et al. |
| 2004/0252738 | A1 | 12/2004 | Hill |
| 2005/0008880 | A1* | 1/2005 | Kunze et al. ................. 428/447 |
| 2005/0054004 | A1* | 3/2005 | Alivisatos et al. ............ 435/7.1 |
| 2005/0117868 | A1 | 6/2005 | Chen |
| 2005/0161666 | A1 | 7/2005 | Park et al. |
| 2005/0187339 | A1* | 8/2005 | Xu et al. ...................... 524/556 |
| 2007/0012907 | A1 | 1/2007 | Hill et al. |

FOREIGN PATENT DOCUMENTS

| | | |
|---|---|---|
| JP | 2000077710 | 3/2000 |
| JP | 2002241509 A | 8/2002 |
| JP | 2003-217861 | 7/2003 |
| JP | 2003533455 A | 11/2003 |
| JP | 2004-095549 | 3/2004 |
| JP | 2004-134395 | 4/2004 |
| JP | 2005048171 A | 2/2005 |
| KR | 1020030011398 | 2/2003 |
| KR | 1020040043071 | 5/2004 |
| KR | 10-2004-0059588 | 7/2004 |
| KR | 1020050116364 | 12/2005 |
| KR | 1020070097308 A | 10/2007 |
| KR | 1020110098857 A | 9/2011 |
| KR | 1020140100126 A | 8/2014 |
| WO | 00/17655 | 3/2000 |
| WO | 0196454 | 12/2001 |
| WO | 03/084292 | 10/2003 |
| WO | 2004009724 A2 | 1/2004 |
| WO | 2004011250 A1 | 2/2004 |
| WO | 2004029176 | 4/2004 |
| WO | 2004034421 | 4/2004 |
| WO | 2005004548 A1 | 1/2005 |

\* cited by examiner

METHOD FOR PREPARING MULTILAYER OF NANOCRYSTALS, AND ORGANIC-INORGANIC HYBRID ELECTROLUMINESCENCE DEVICE COMPRISING MULTILAYER OF NANOCRYSTALS PREPARED BY THE METHOD

This is a continuation in part of divisional application having U.S. patent application Ser. No. 13/475,610 filed on May 18, 2012, which is a divisional application of U.S. patent application Ser. No. 12/432,180 filed on Apr. 29, 2009, which is a divisional application of U.S. application Ser. No. 11/002,461 filed on Dec. 3, 2004, and claims priority under 35 U.S.C. 119(a) to Korean Patent Application No. 2004-38391 filed on May 28, 2004, which is hereby expressly incorporated by reference in its entirety.

BACKGROUND OF THE INVENTION

Field of the Invention

The present invention relates to a method for preparing a multilayer of nanocrystals, and an organic-inorganic hybrid electroluminescence device comprising a multilayer of nanocrystals prepared by the method. More particularly, the present invention relates to a method for preparing a multilayer of nanocrystals by (i) coating nanocrystals surface-coordinated by a photosensitive compound, or a mixed solution of a photosensitive compound and nanocrystals surface-coordinated by a material miscible with the photosensitive compound, on a substrate, drying the coated substrate, and exposing the dried substrate to UV light to form a first monolayer of nanocrystals, and (ii) repeating the procedure of (i) to form one or more monolayers of nanocrystals on the first monolayer of nanocrystals; and an organic-inorganic hybrid electroluminescence device using the multilayer of nanocrystals prepared by the method, as a luminescent layer. The use of the multilayer of nanocrystals as a luminescent layer can enhance luminescent efficiency and luminescence intensity of the electroluminescence device, and can control electrical properties of the electroluminescence device.

Description of the Related Art

A nanocrystal is defined to be a material having a crystal size at the nanometer-scale level, and consists of a few hundred to a few thousand atoms. Since the nanocrystal has a large surface area per unit volume, most of the atoms constituting the nanocrystal are present at the surface of the nanocrystal. Based on this structure, the nanocrystal exhibits quantum confinement effects, and shows electrical, magnetic, optical, chemical and mechanical properties different from those inherent to the constituent atoms of the nanocrystal. That is, the control over the physical size of the nanocrystal enables the control of various properties.

Vapor deposition processes, such as metal organic chemical vapor deposition (MOCVD) and molecular beam epitaxy (MBE), have been conventionally used to prepare nanocrystals. On the other hand, a wet chemistry technique wherein a precursor material is added to an organic solvent to grow nanocrystals to a desired size has made remarkable progress in the past decade. According to the wet chemistry technique, as the crystals are grown, the organic solvent is naturally coordinated to the surface of the quantum dot crystals and acts as a dispersant. Accordingly, the organic solvent allows the crystals to grow to the nanometer-scale level. The wet chemistry technique has an advantage in that nanocrystals can be uniformly prepared in size and shape in a relatively simple manner at low cost, compared to conventional vapor deposition processes, e.g., MOCVD and MBE. However, since nanocrystals prepared by the wet chemistry technique are commonly dispersed in an organic solvent, techniques for forming a thin film of the nanocrystals are required in order to apply the nanocrystals to electronic devices.

Conventionally, a self-assembly process has been mainly used to form a thin film of nanocrystals prepared by the wet chemistry technique. For example, U.S. Pat. No. 5,751,018 discloses a method for attaching semiconductor nanocrystals to solid inorganic surfaces, using self-assembled bifunctional organic monolayers as bridge compounds. Further, Korean Patent Application No. 2002-85262 discloses a method for preparing a multilayer of nanocrystals by bonding a dithiol group to the surface of nanocrystals to form disulfide bonds between the nanocrystals. Further, a method is disclosed for preparing a multilayer of nanocrystals by charge-charge interaction. According to this method, nanocrystals surface-substituted with a charged compound are bound to an oppositely charged substrate to form a thin film of the nanocrystals, an organic compound oppositely charged to the nanocrystals is bound on the thin film, and then the above procedure is repeated.

However, these methods for forming a thin film of nanocrystals by self-assembly have a problem that they involve an additional step of treating the surface of nanocrystals and a substrate with a compound containing a specific functional group, rendering the overall procedure more complex.

Meanwhile, electroluminescence devices using nanocrystals as a luminescent layer are described in U.S. Pat. Nos. 5,537,000, 6,608,439 and 6,049,090, and PCT publication WO 03/084292.

U.S. Pat. No. 5,537,000 describes an electroluminescence device without an organic electron transport layer in which a multilayer of nanocrystals acts as both a luminescent layer and an electron transport layer, and the wavelengths of emitted light are dependent on a voltage applied to the device. However, the patent publication simply describes that the multilayer of nanocrystals can be prepared by the use of a self-assembly process mentioned in U.S. Pat. No. 5,751,018, but fails to specifically describe a process for forming a monolayer of nanocrystals or preparing a multilayer of nanocrystals using the monolayer.

PCT publication WO 03/084292 describes an organic-inorganic luminescence device which comprises a matrix containing a large number of nanocrystals and disposed between two electrodes. This patent publication also suggests a method for enhancing electroluminescent performance of the device by spin-coating a mixture of nanocrystals and a low-molecular weight hole transporting material (e.g., N,N'-diphenyl-N,N'-bis(3-methylphenyl)-(1,1'-biphenyl)-4,4'-diamine (TPD)) on an electrode, and introducing an organic electron transport layer and electron/hole blocking layers into the device, thereby allowing the organic layer to transport electrons and holes and allowing the nanocrystals to emit light.

Further, U.S. Pat. No. 6,608,439 discloses an integrated organic light emitting diode color display device in which nanocrystals used as a color-conversion layer absorb monochrome and short-wavelength light emitted from an organic layer, and then emit photoluminescence (PL) at a different wavelength. However, the luminescence device is not driven by electroluminescence.

Further, U.S. Pat. No. 6,049,090 describes a device using a mixed layer of nanocrystals-matrix as a luminescent layer disposed between two electrodes wherein the band gap energy and the conduction band energy level of the matrix are more than those of the nanocrystals. The patent publication also explains that since electrons and holes are trapped by the matrix, the luminescent efficiency of the device can be enhanced.

As described above, there are few reports on the preparation of a multilayer of nanocrystals used as a luminescent layer in order to enhance the luminescent efficiency of electroluminescence devices, except for the self-assembly process involving complicated steps.

SUMMARY OF THE INVENTION

Thus, the present inventors have earnestly and intensively conducted research to solve the problems of conventional methods for preparing a multilayer of nanocrystals in terms of complicated procedures. As a result, the present inventors have found that when nanocrystals surface-coordinated by a photosensitive compound are coated on a substrate and exposed to UV light, a crosslinking reaction takes place between photosensitive functional groups of the photosensitive compound to form a network structure, resulting in the formation of a monolayer of nanocrystals insoluble in solvents, and further the preparation of a multilayer of nanocrystals in a relatively simple manner when compared to prior art methods. The present invention is based on this finding.

Therefore, it is an object of the present invention to provide a method for preparing a multilayer of nanocrystals in a simple manner, without the need for a complicated process, such as self-assembly of nanocrystals.

It is another object of the present invention to provide a method for preparing a multilayer of nanocrystals-polymer by utilizing the method for preparing a multilayer of nanocrystals.

It is yet another object of the present invention to provide an electroluminescence device with enhanced luminescent efficiency using a multilayer of nanocrystals or a multilayer of nanocrystals-polymer prepared by any one methods of the present invention, as a luminescent layer.

In accordance with one aspect of the present invention, the above objects can be accomplished by a method for preparing a multilayer of nanocrystals comprising the steps of: (i) coating nanocrystals surface-coordinated by a photosensitive compound, or a mixed solution of a photosensitive compound and nanocrystals surface-coordinated by a material miscible with the photosensitive compound, on a substrate, drying the coated substrate, and exposing the dried substrate to UV light to form a first monolayer of nanocrystals; and (ii) repeating the procedure of step (i) to form one or more monolayers of nanocrystals on the first monolayer of nanocrystals.

In accordance with another aspect of the present invention, there is provided a method for preparing a multilayer of nanocrystals-polymer comprising the steps of: (i) coating nanocrystals surface-coordinated by a photosensitive compound, or a mixed solution of a photosensitive compound and nanocrystals surface-coordinated by a material miscible with the photosensitive compound, on a substrate, drying the coated substrate, and exposing the dried substrate to UV light to form a first monolayer of nanocrystals; (ii) forming a first polymer monolayer on the first monolayer of nanocrystals; and (iii) repeating the procedure of step (i) and/or step (ii) to form one or more monolayers of nanocrystals and/or one or more polymer monolayers on the first polymer monolayer.

In accordance with yet another aspect of the present invention, there is provided an organic-inorganic hybrid electroluminescence device using a multilayer of nanocrystals or a multilayer of nanocrystals-polymer prepared by any one methods of the present invention, as a luminescent layer disposed between a pair of electrodes.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

The present invention will now be described in more detail with reference to the accompanying drawings.

Preparation of Multilayer of Nanocrystals

First, nanocrystals surface-coordinated by a photosensitive compound, or a mixed solution of a photosensitive compound and nanocrystals surface-coordinated by a material miscible with the photosensitive compound is coated on a substrate, dried, and then exposed to UV light to form a first monolayer of nanocrystals. Thereafter, the above procedure is repeated to form one or more monolayers of nanocrystals on the first monolayer of nanocrystals, thereby preparing a multilayer of nanocrystals.

In the method of the present invention, the nanocrystals are prepared by a wet chemistry technique, and the surface of the nanocrystals is coordinated by an appropriate dispersant in order to minimize agglomeration between the nanocrystals and prevent precipitation of the agglomerated nanocrystals.

In this manner, when the nanocrystals surface-coordinated by the photosensitive compound are coated on a substrate and exposed to a high-energy light source, such as UV light, a crosslinking reaction takes place between photosensitive functional groups of the photosensitive compound. This crosslinking reaction enables the formation of a network structure of the nanocrystals, resulting in the formation of a monolayer of nanocrystals insoluble in solvents.

Figure 1:
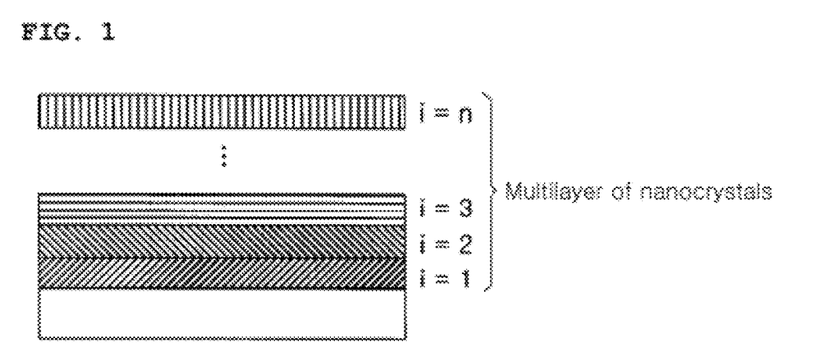
FIG. 1 is a schematic view showing the structure of a multilayer of nanocrystals prepared by a method of the present invention.

On the other hand, when a uniformly mixed solution of a photosensitive compound and nanocrystals surface-coordinated by a dispersant containing no photosensitive functional group but miscible with the photosensitive compound is coated on a substrate and exposed to a high-energy light source, such as UV light, a crosslinking reaction takes place between photosensitive functional groups of the photosensitive compound. This crosslinking reaction enables the inclusion of the nanocrystals in a network structure, resulting in the formation of a first monolayer of nanocrystals insoluble in solvents. Thereafter, the above procedure is repeated to form one or more monolayers of nanocrystals on the first monolayer, thereby preparing a multilayer of nanocrystals. The structure of the multilayer of nanocrystals is schematically shown in FIG. 1.

Nanocrystals usable in the present invention may include all nanocrystals prepared from metal precursors by a wet chemistry technique. For example, the nanocrystals may be prepared by adding a corresponding metal precursor to an organic solvent in the absence or presence of a dispersant, and growing crystals at a predetermined temperature.

That is, nanocrystals used in the present invention include most of the nanocrystals prepared by a wet chemistry technique, such as metal nanocrystals and semiconductor nanocrystals. As suitable nanocrystals, there may be mentioned, for example: metal nanocrystals, such as Au, Ag, Pt, Pd, Co, Cu, Fe, Al, Ni, Ir, Rh, Ru, and Mo; Group II-VI compound semiconductor nanocrystals, such as CdS, CdSe, CdTe, ZnS, ZnSe, ZnTe, HgS, HgSe and HgTe; and Group III-V compound semiconductor nanocrystals, such as GaN, GaP, GaAs, InP, InAs InN, AlN, Alp, and AlAs; and Group IV-VI compound semiconductor PbS, PbSe, PbTe. As needed, there can be used a mixture of two or more nanocrystals, for example: nanoparticles in a simple mixture state of at least two nanocrystal compounds; fused crystals in which at least two compound crystals are partially present in the same crystal structure, e.g., core-shell structured crystals and gradient-structured crystals, and alloys of at least two nanocrystal compounds.

According to the method of the present invention, the monolayers constituting the multilayer of nanocrystals may be composed of one kind of nanocrystals, or two or more kinds of nanocrystals. That is, the multilayer of nanocrystals may have the same or different layer constitution.

The photosensitive compound coordinated to the surface of the nanocrystals is a compound wherein a photoreactive functional group (e.g., carbon-carbon double bond or acryl group) is selectively bonded to a linker (e.g., cyanide, thiol (SH), amino, carboxylic acid group or phosphonic acid group) through an alkylene, amide, phenylene, biphenylene, ester or ether group.

The nanocrystals surface-coordinated by the photosensitive compound can be prepared by obtaining nanocrystals from a corresponding metal precursor, dispersing the obtained nanocrystals in an organic solvent, and treating the dispersion with the photosensitive compound. The treatment with the photosensitive compound is not especially limited, but is preferably carried out by refluxing the dispersion of the nanocrystals in the presence of the photosensitive compound. The reflux conditions, including time and temperature, and the concentration of the photosensitive compound can be properly controlled according to the kind of the photosensitive compound coordinated to the surface of the nanocrystals, the dispersing solvent and the nanocrystals. For instance, nanocrystals are surface-coordinated by a dispersant (e.g., mercaptopropanol) having a reactive end group, and are then reacted with a photosensitive compound (e.g., methacryloyl chloride) capable of reacting with the reactive end group of the dispersant, thereby preparing nanocrystals surface-coordinated by the photosensitive compound.

Alternatively, nanocrystals directly surface-coordinated by a photosensitive compound may be prepared by adding a corresponding metal precursor to an organic solvent in the presence of the compound having a photosensitive functional group, and growing crystals at a predetermined temperature. The kind of the organic solvent, the crystal-growth temperature and the concentration of the precursor can be appropriately varied according to the kind of the photosensitive compound, and the kind, size and shape of the desired nanocrystals.

The coating of the nanocrystals on a substrate may be carried out by a spin coating, dip coating, spray coating or blade coating process, but is not especially limited thereto.

Considering the melting point of the solvent dispersing the nanocrystals, the drying of the coated substrate may be carried out at 20~300° C. and preferably 40~120° C. for complete removal of the solvent.

The exposure of the dried substrate may be carried out by a contact exposure or non-contact exposure process. In addition, the energy for photosensitization treatment is dependent on the thickness of the monolayer, and is preferably in the range of 50~850 mJ/cm$^2$. When the exposure energy is out of this range, a crosslinking reaction is not likely to take place, or there is a risk of damage to the monolayer. Considering absorption wavelength of the photosensitive group and crosslinking reaction conditions, light sources usable for the light exposure preferably have an energy in the range of 100-800 W at an effective wavelength of 200-500 nm and preferably 300-400 nm.

Preparation of Multilayer of Nanocrystals-Polymer

The present invention is also directed to a method for preparing a multilayer of nanocrystals-polymer. First, nanocrystals surface-coordinated by a photosensitive compound, or a mixed solution of a photosensitive compound and nanocrystals surface-coordinated by a material miscible with the photosensitive compound is coated on a substrate, dried, and exposed to UV light to form a first monolayer of nanocrystals (step (i)). Next, a first polymer monolayer is formed on the first monolayer of nanocrystals (step (ii)). Thereafter, step (i) and/or step (ii) are repeated to form one or more monolayers of nanocrystals and/or one or more polymer monolayers on the first polymer monolayer, thereby preparing a multilayer of nanocrystals-polymer.

Like the method for preparing a multilayer of nanocrystals, a first monolayer of nanocrystals is formed in step (i). Thereafter, a polymer monolayer is formed on the monolayer of nanocrystals. At this time, since the exposed monolayer of nanocrystals is highly stable in solvents, a monolayer composed of a polymer or a polymer precursor can be formed on the first monolayer of nanocrystals. Using a solvent causing no damage to the monolayer composed of a polymer or a polymer precursor, another monolayer of nanocrystals is formed on the monolayer composed of a polymer or a polymer precursor to prepare the final multilayer of nanocrystals-polymer.

Consequently, the multilayer of nanocrystals-polymer can be prepared by coating nanocrystals on a substrate, exposing the coated substrate to UV light to form a first monolayer of nanocrystals insoluble in solvents, forming a polymer monolayer on the first monolayer of nanocrystals, forming another monolayer of nanocrystals on the polymer thin film, and repeating the overall procedure. At this time, at least one kind of nanocrystals and at least one kind of polymers may be used. In addition, the multilayer of nanocrystals-polymer can be prepared by alternately layering the monolayer of nanocrystals and the polymer monolayer, or alternately layering several monolayers of nanocrystals and several polymer monolayers.

Fabrication of Organic-Inorganic Hybrid Electroluminescence Device Comprising Multilayer of Nanocrystals or Multilayer of Nanocrystals-Polymer The multilayer of nanocrystals or the multilayer of nanocrystals-polymer prepared by the method of the present invention is used as a luminescent layer of an organic-inorganic hybrid electroluminescence device.

Figure 2:
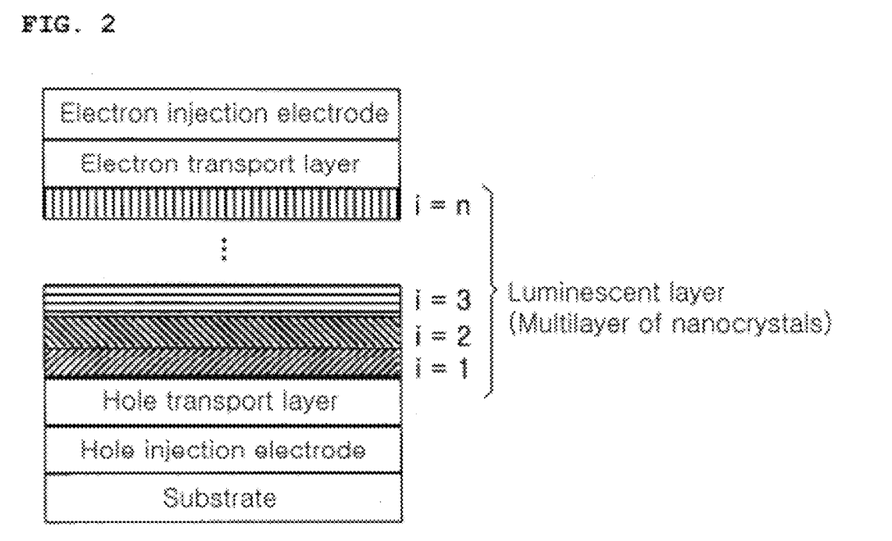
FIG. 2 is a schematic view showing the structure of an organic-inorganic hybrid electroluminescence device using a multilayer of nanocrystals prepared in accordance with one embodiment of the present invention, as a luminescent layer.

An organic-inorganic hybrid electroluminescence device according to one embodiment of the present invention is schematically shown in FIG. 2. As shown in FIG. 2, the multilayer of nanocrystals is used as a luminescent layer disposed between a pair of electrodes. Specifically, the organic-inorganic hybrid electroluminescence device comprises a substrate, a hole injection electrode, a hole transport layer, a luminescent layer (the multilayer of nanocrystals), an electron transport layer, and an electron injection electrode layered in this order from the bottom.

Figure 3:
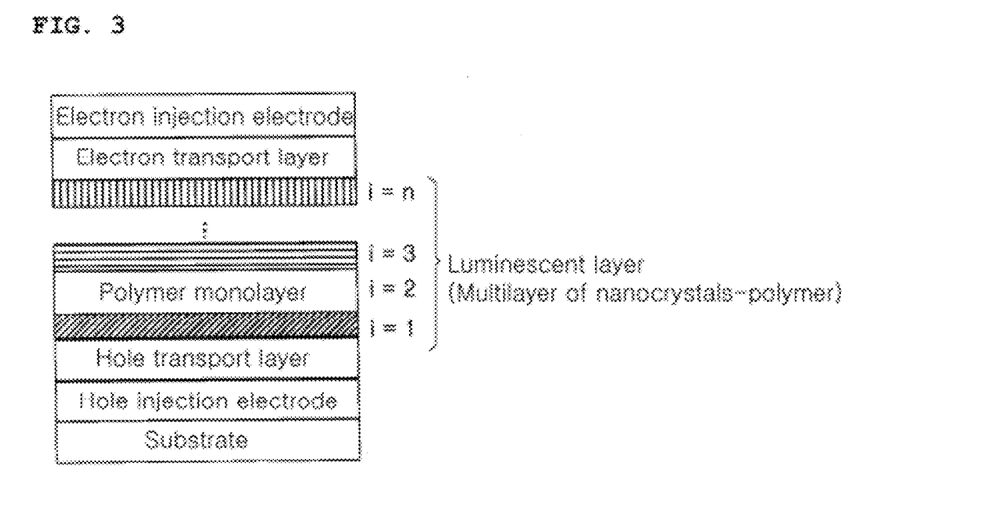
FIG. 3 is a schematic view showing the structure of an organic-inorganic hybrid electroluminescence device using a multilayer of nanocrystals-polymer prepared in accordance with another embodiment of the present invention, as a luminescent layer.

An organic-inorganic hybrid electroluminescence device according to one embodiment of the present invention is schematically shown in FIG. 3. As shown in FIG. 3, the multilayer of nanocrystals-polymer is used as a luminescent layer disposed between a pair of electrodes. Specifically, the organic-inorganic hybrid electroluminescence device comprises a substrate, a hole injection electrode, a hole transport layer, a luminescent layer (the multilayer of nanocrystals-polymer), an electron transport layer, and an electron injection electrode layered in this order from the bottom.

The organic-inorganic hybrid electroluminescence device of the present invention using the multilayer of nanocrystals or the multilayer of nanocrystals-polymer as a luminescent layer may further comprise an electron blocking layer and/or a hole blocking layer interposed between the luminescent layer and the hole transport layer or between the luminescent layer and the electron transport layer.

The organic-inorganic hybrid electroluminescence devices shown in FIGS. 2 and 3 are fabricated by a method comprising the steps of: (i) forming a hole injection electrode (anode) on a substrate; (ii) forming a hole transport layer (HTL) on the hole injection electrode; (iii) forming the multilayer of nanocrystals or the monolayer of nanocrystals-polymer prepared by the method of the present invention (i.e. a luminescent layer), on the hole transport layer; (iv) forming an electron transport layer (ETL) on the multilayer; and (v) forming an electron injection electrode (cathode) on the electron transport layer.

Examples of suitable substrates of the organic-inorganic hybrid electroluminescence device according to the present invention include those commonly used in the art of organic electroluminescence devices. A glass or transparent plastic substrate is preferably used in terms of superior transparency, superior surface smoothness, easy handling properties, and excellent waterproofness. Specific examples are preferably glass, polyethyleneterephthalate, and polycarbonate substrates. The thickness of the substrate is preferably in the range of 0.3~1.1 mm.

The hole injection electrode can be formed of a conductive metal or an oxide thereof, for example, indium tin oxide (ITO), indium zinc oxide (IZO), nickel (Ni), platinum (Pt), gold (Au), silver (Ag), or iridium (Ir). The substrate on which the electrode is formed is commonly washed with solvents, such as a neutral detergent, deionized water, acetone and isopropyl alcohol, and is then subjected to UV-ozone and plasma treatment.

As materials for the hole transport layer, polymeric materials causing no damage to the multilayer of nanocrystals or the multilayer of nanocrystals-polymer are preferably used. As the polymeric materials, there may be mentioned, for example, poly(3,4-ethylenedioxythiophene) (PEDOT)/polystyrene para-sulfonate (PSS), polytriphenylamine, polyphenylenevinylene and derivatives thereof, and polyfluorene and derivatives thereof. The thickness of the hole transport layer is preferably in the range of 10 to 100 nm.

The multilayer of nanocrystals or the multilayer of nanocrystals-polymer is prepared by the method of the present invention.

In order to prepare the multilayer of nanocrystals-polymer used as a luminescent layer of the organic-inorganic hybrid electroluminescence device according to the present invention, the polymer is preferably selected from materials capable of transporting holes and electrons or controlling the transportation rate. Examples of suitable polymers include poly(3,4-ethylenedioxythiophene) (PEDOT)/polystyrene para-sulfonate (PSS), polytriphenylamine, polyphenylenevinylene and derivatives thereof, polyfluorene, polyaniline, and polypyrrole and derivatives thereof. The formation of at least one polymer monolayer capable of transporting holes and electrons or controlling the transportation rate between monolayers of nanocrystals enables an active control in transportation of holes and electrons, allowing the monolayers of nanocrystals to emit light or enhancing the luminescent efficiency of the device.

Low- and high-molecular weight materials commonly used in the art can be used to form the electron transport layer, unlike the materials for the hole transport layer. As materials constituting the electron transport layer, there may be mentioned, for example, oxazoles, isooxazoles, triazoles, isothiazoles, oxydiazoles, thiadiazoles, perylenes, and aluminum complexes, including tris(8-hydroxyquinoline)-aluminum (Alq3), bis(2-methyl-8-quinolinolato)(p-phenylphenolato) aluminum (Balq) and bis(2-methyl-8-quinolinolato)(triphenylsiloxy) aluminum (III) (Salq). The thickness of the electron transport layer is preferably between 10 nm and 100 nm.

Examples of suitable materials for the electron blocking layer and/or the hole blocking layer include those commonly used in the art. Specific examples are 3-phenyl-4-(1'-naphthyl)-5-phenyl-1,2,4-triazole (TAZ), 2,9-dimethyl-1,10-phenanthroline (BCP), phenanthrolines, imidazoles, triazoles, oxadiazoles, and aluminum complexes. The thickness of the electron blocking layer and the hole blocking layer is preferably in the range of 5 nm to 50 nm.

As a material for the electron injection electrode, there can be used a metal having a low work function, such as I, Ca, Ba, Ca/Al, LiF/Ca, LiF/Al, BaF$_2$/Al, BaF$_2$/Ca/Al, Al, Mg, or a Ag—Mg alloy. The thickness of the electron injection electrode is preferably in the range of 50 nm to 300 nm.

The fabrication of the organic-inorganic hybrid electroluminescence device of the present invention does not require particular fabrication apparatuses and methods, except the formation of the luminescent layer. The organic-inorganic hybrid electroluminescence device of the present invention can be fabricated in accordance with conventional fabrication methods using common luminescent materials.

Fabrication of Nanocrystal-Polymer Composite Thin Film Using Patterned Mold

The present invention is also directed to a method for fabricating a nanocrystal-polymer composite thin film. In the fabrication of the nanocrystal-polymer composite thin film, a photocurable composition comprising semiconductor nanocrystals surface-coordinated with a photosensitive compound, and a photocurable compound is prepared (i), and the photocurable composition is applied to a substrate to form a photocurable composition coating layer. Subsequently, the photocurable composition coating layer is treated with a mold having a predetermined pattern to form the predetermined pattern on a surface of the photocurable composition coating layer. The photocurable composition coating layer is exposed to a light to obtain a nanocrystal-polymer composite thin film. Hereinafter, respective steps will be described in detail.

Figure 7A:
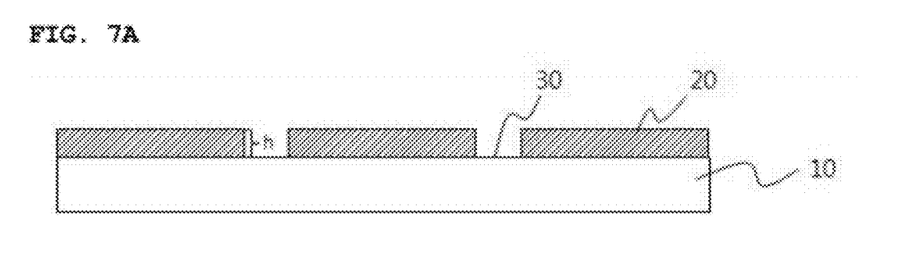
FIGS. 7A and 7B are schematic views showing structures of a nanocrystal-polymer thin film prepared by a method of the present invention.

The mold has a surface with the predetermined pattern, wherein the predetermined pattern includes a recessed shape (FIG. 7b) and/or protruded shape (FIG. 7A). The predetermined pattern has a rectangular shape, a triangular shape, a trapezoidal shape, a cone shape, a prism shape, a pyramid shape or a combination thereof.

Figure 7B:
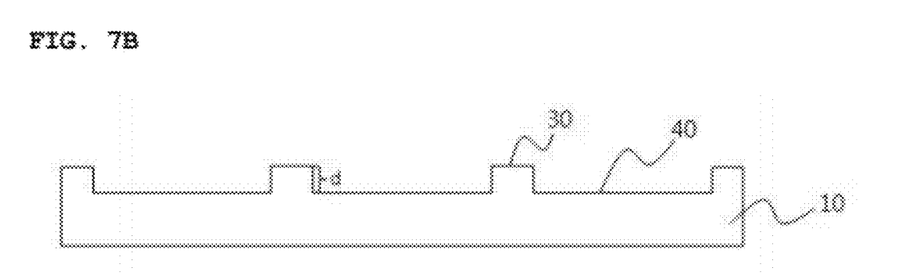

The predetermined pattern on the photocurable composition coating layer has a vertical size in a range from about 10 um to about 250 um. The term "vertical size" as used herein shall means a height (h) of a protrusion in case that the predetermined pattern includes a protruded shape (FIG. 7A). The term "vertical size" as used herein means a depth(d) of a recession in case that the predetermined pattern includes a recessed shape (FIG. 7B).

The surface of the photocurable composition coating layer comprises a patterned area and a non-patterned area, and wherein a ratio of the patterned area to the non-patterned area is in a range from about 0.002 to about 2. The term "patterned area" as used herein shall means a protruded portion (20) or recessed portion(40) of the surface, and the term "a non-patterned area" as used herein shall means a unchanged flat portion(30) of the surface.

(i) Preparation of Photocurable Composition

In the fabrication of the nanocrystal-polymer composite thin film, a photocurable composition comprising nanocrystals surface-coordinated with a photosensitive compound ("photosensitive nanocrystals") and a photocurable compound is prepared. This photocurable composition may further comprise a solvent, a photoinitiator or a binder polymer.

The photosensitive compound coordinating the surface of the nanocrystals is a compound in which a photocurable functional group such as a double bond or an acrylic group is selectively bonded to a linker such as cyanide, SH, amine, a carboxyl group and a phosphonic acid group through an alkylene group, an amide group, a phenylene group, a biphenylene group, an ester group, an ether group or the like.

The photocurable compound comprises a photopolymerizable monomer, a photopolymerizable oligomer or a mixture thereof and they are selected from the group consisting of a compound having one or more acrylic groups and/or vinyl groups, an ester-based compound, an ether-based compound and a mixture thereof. The photopolymerizable monomer and oligomer may be selected from general reactive monomers and oligomers. Useful examples thereof include acrylates, epoxy acrylates, urethane acrylates, polyester acrylates, bisphenols and mixtures thereof.

Examples of the photocurable compound include, but are not limited to allyloxylated cyclohexyl diacrylate, bis(acryloxy ethyl)hydroxyl isocyanurate, bis(acryloxy neopentylglycol) adipate, bisphenol A diacrylate, bisphenyl A dimethacrylate, 1,4-butanediol diacrylate, 1,4-butanediol dimethacrylate, 1,3-butyleneglycol diacrylate, 1,3-butyleneglycol dimethacrylate, dicyclopentanyl diacrylate, diethyleneglycol diacrylate, diethyleneglycol dimethacrylate, dipentaerythirol hexaacrylate, dipentaerythirol monohydroxy pentacrylate, ditrimethylolprpane tetraacrylate, ethyleneglycol dimethacrylate, glycerol methacrylate, 1,6-hexanediol diacrylate, neopentyiglycol dimethacrylate, neopentyiglycol hydroxypivalate diacrylate, pentaerythritol triacrylate, pentaerythritol tetraacrylate, phosphoric acid dimethacrylate, polyetyleneglycol diacrylate, polypropyleneglycol diacrylate, tetraethyleneglycol diacrylate, tetrabromobisphenol A diacrylate, triethyleneglycol divinylether, triglycerol diacrylate, trimethyloipropane triacrylate, tripropyleneglycol diacrylate, tris(acryloxyethyl)isocyanurate, phosphoric acid triacrylate, phosphoric acid diacrylate, acrylic acid propargyl ester, vinyl terminated potydimethylsiloxane, vinyl terminated diphenylsiloxane-dimethylsiloxane copolymer, vinyl terminated polyphenylmethylsiloxane, vinyl terminated trifluoromethylsiloxane-dimethylsiloxane copolymer, vinyl terminated diethylsiloxane-dimethylsiloxane copolymer, vinylmethylsiloxane, monomethacryloyloxypropyl terminated polydimethyl siloxane, monovinyl terminated polydimethyl siloxane and monoallyl-mono trimethylsiloxy terminated polyethylene oxide.

Examples of the binder polymer include, but are not limited to methyl acrylate, methyl methacrylate, ethyl acrylate, methyl methacrylate, butyl acrylate, butyl methacrylate, acrylic acid, methacrylic acid, 2-hydroxyethyl acrylate, 2-hydroxyethyl methacrylate, 2-hydroxypropyl acrylate, 2-hydroxypropyl methacrylate, acrylamide, methacrylamide, styrene, a-methyl styrene, and linear acrylic acid polymers synthesized from monofunctional derivatives such as phenoxy ethyl acrylate derivatives, isobornylacrylate and isobornyl methacrylate.

The desired wavelength of light can be emitted by controlling composition and size of semiconductor nanocrystals. That is, various wavelengths of light including blue, green and red can be easily realized from semiconductor nanocrystals.

In the composition of the present invention, a ratio of the photosensitive semiconductor nanocrystals to the photocurable compound is not particularly limited and may be suitably determined while taking into consideration photocurability (curing rate and conditions of cured thin films) and coordination performance of the photocurable compound and nanocrystals.

The photoinitiator used in the present invention comprises all well-known initiators capable of forming free radicals through light irradiation and preferred examples thereof include acetophenone, benzoin, benzophenone, triazine and the like.

(ii) Formation of Photocurable Composition Coating Layer

After the photocurable composition comprising nanocrystals surface-coordinated with a photosensitive compound is prepared, this composition is applied to a substrate, to form a photocurable composition coating layer. The thickness of the photocurable composition coating layer is not particularly limited.

The application method used for formation of the photocurable composition coating layer is not particularly limited and useful examples thereof include spin coating, dip coating, roll coating, screen coating, spray coating, spin casting, flow coating, screen printing, inkjet vapor jetting, drop casting and the like.

(iii) Formation of Thin Film Using Patterned Mold

After the photocurable composition coating layer is formed, this coating layer is treated with a mold having a predetermined pattern. Subsequently, the mold is separated and removed, and the remaining structure is exposed by irradiation of electromagnetic waves. In this case, in the exposure region, cross-linkage occurs between the photocurable functional groups or the photocurable compounds, to produce a network structure on crystals and thereby form a nanocrystal-polymer composite thin film. The exposure is carried out by contact or non-contact exposure and the amount of exposure is not particularly limited and may be suitably selected depending on thickness of thin films. Preferably, exposure is carried out using a light source having an energy of 100 to 800 W at a wavelength of 200 to 500 nm and the amount of exposure is in the range of 50 $mJ/cm^2$ to 200 $mJ/cm^2$.

When the nanocrystal-polymer composite thin film is formed using the mold having a predetermined pattern, thin films having a reduced difference in thickness, as compared to thin films fabricated using a conventional method such as imprinting, can be obtained.

The nanocrystal-polymer composite thin film may be provided as a multilayer having two or more layers. In this case, the nanocrystal-polymer composite thin films having two or more layers can be formed by repeating formation of the photocurable composition comprising semiconductor nanocrystals surface-coordinated with the photosensitive compound and the exposure, two or more times.

The obtained nanocrystal-polymer composite thin films having two or more layers may be joined by lamination. At this time, the thin film patterns may be laminated such that they overlap one another at a predetermined angle.

In the formation of multilayer nanocrystal-polymer composite thin films, respective layers of semiconductor nanocrystal-polymer composite thin films may be formed using semiconductor nanocrystals having different sizes.

This nanocrystal-polymer composite thin film may be employed as a photoconversion layer for a liquid crystal display device. For example, the nanocrystal-polymer composite thin film may be disposed between a light guide plate and a prism sheet. In particular, when the nanocrystal-polymer composite thin film is used for a backlight using an LED as a light source, high color purity can be realized and high quality display device can thus be realized.

Hereinafter, the present invention will be specifically explained with reference to the following examples. However, these examples are given for the purpose of illustration and are not to be construed as limiting the scope of the invention.

PREPARATIVE EXAMPLE 1

Preparation of CdSeS Nanocrystals Surface-Coordinated by Photosensitive Compound Containing Double Bond 16 g of trioctylamine, 0.5 g of oleic acid and 0.4 mmol of cadmium oxide were charged simultaneously into a 125 ml flask equipped with a reflux condenser. The temperature of the mixture was raised to 300° C. with stirring. Separately, a selenium (Se) powder was dissolved in trioctyl phosphine (hereinafter, referred to as TOP) to obtain a Se-TOP complex solution (Se concentration: about 0.25M), and a sulfur (S) powder was dissolved in TOP to obtain an S-TOP complex solution (S concentration: about 1.0M). 0.9 ml of the S-TOP complex solution and 0.1 ml of the Se-TOP complex solution were rapidly fed to the previous mixture, and then reacted for 4 minutes with stirring. After the reaction was completed, the reaction mixture was cooled to room temperature as rapidly as possible. Ethanol as a non-solvent was added to the reaction mixture, and the resulting mixture was then centrifuged. After the obtained precipitates were separated from the mixture by decanting the supernatant, 1 wt % of the precipitates were dispersed in toluene to prepare a dispersion of CdSeS nanocrystals. A luminescence peak in the photoluminescence spectrum of the nanocrystals was observed around 550 nm, and the nanocrystals emitted yellowish green light under a UV lamp at 365 nm.

PREPARATIVE EXAMPLE 2

Synthesis of Green Semiconductor Nanocrystals 16 g of trioctylamine (hereinafter, referred to "TOA"), 0.3 g of octadecylphosphonic acid and 0.4 mmol of cadmium oxide were charged into a 125 ml flask equipped with a reflux condenser. Vacuum was applied and the temperature of the mixture was raised to 120° C. with stirring. Then, the atmosphere was replaced with nitrogen and the reaction temperature was adjusted to 300° C.

Separately, selenium (Se) powder was dissolved in trioctyl phosphine (hereinafter, referred to as TOP) to obtain a Se-TOP complex solution having a Se concentration of about 2 M, and the 2M Se-TOP complex solution was rapidly added to the 300° C. reaction mixture with stirring, followed by reaction for about 2 minutes.

After reaction was completed, the reaction mixture was cooled to room temperature (about 23° C. to 25° C.) as rapidly as possible. Ethanol as a non-solvent was added to the reaction mixture, and the resulting mixture was then centrifuged. After the obtained precipitates were separated from the mixture by decanting the supernatant and the precipitates were dispersed in toluene to prepare a CdSeS nanocrystal solution which emits light at 485 nm.

8 g of TOA, 0.1 g of oleic acid and 0.4 mmol of zinc acetate ($Zn(Et)_2$) were simultaneously charged into a 125 ml flask equipped with a reflux condenser, and the reaction temperature was adjusted to 300° C. while stirring. 1 wt % of the synthesized CdSe nanocrystal solution was added to the reactant, 2 ml of 0.4M S-TOP complex solution was slowly added thereto, and the reaction was proceeded for about one hour to grow ZnS nanocrystals on the surface of CdSe nanocrystals, and CdSe//ZnS alloy nanocrystals were formed by diffusion on the interface therebetween.

After the reaction was completed, the reaction mixture was cooled to room temperature as rapidly as possible. Ethanol as a non-solvent was added to the reaction mixture, and the resulting mixture was then centrifuged. After the obtained precipitates were separated from the mixture by decanting the supernatant and the precipitates were dispersed in toluene.

8 g of TOA, 0.1 g of oleic acid, 0.05 mmol of cadmium oxide, and 0.4 mmol of zinc acetate were simultaneously charged into a 125 ml flask equipped with a reflux condenser, and the reaction temperature was adjusted to 300° C. while stirring. 1 wt % of the synthesized CdSe//ZnS nanocrystal solution was added to the reactant, 2 ml of 0.4M S-TOP complex solution was slowly added thereto, and the reaction was proceeded for about one hour to grow CdSZnS nanocrystals on the surface of CdSe//ZnS nanocrystals, and thereby synthesize CdSe//ZnS/CdSZnS nanocrystals that emit light at 533 nm.

After the reaction was completed, the reaction mixture was cooled to room temperature as rapidly as possible. Ethanol as a non-solvent was added to the reaction mixture, and the resulting mixture was then centrifuged. After the obtained precipitates were separated from the mixture by decanting the supernatant and the precipitates were dispersed in toluene to synthesize a CdSe//ZnS/CdSZnS nanocrystal solution.

PREPARATIVE EXAMPLE 3

Synthesis of Red Semiconductor Nanocrystals 200 g of TOA, 5.4 g of oleic acid and 0.618 g of cadmium oxide were charged into a 125 ml round flask equipped with a reflux condenser. The reaction temperature was raised to 300° C. with stirring. Separately, selenium (Se) powder was dissolved in TOP to obtain a Se-TOP complex solution having a Se concentration of about 0.2M. 2 mL of the 2M Se-TOP complex solution was rapidly added to the 300° C. reaction mixture with stirring, followed by reaction for about 90 seconds to obtain a reaction mixture.

A mixture of 2.4 mmol of octane thiol and 2 mL of TOA 2 mL was slowly added dropwise to the reaction mixture, followed by reaction for 30 minutes to obtain a reaction mixture.

Separately, 16 mmol of zinc acetate was dissolved in 4 mL of TOA, and the resulting solution was slowly added dropwise to the reaction mixture. Immediately after completion of the addition, a mixture of 20 mmol of octane thiol and 4 mL of TOA was added dropwise thereto and reaction was proceeded for 60 minutes.

After the reaction was completed, the reaction mixture was cooled to room temperature as rapidly as possible. Ethanol as a non-solvent was added to the reaction mixture, and the resulting mixture was then centrifuged. After the obtained precipitates were separated from the mixture by decanting the supernatant and the precipitates were dispersed in toluene to prepare a CdSe/CdS/ZnS nanocrystal solution which emits light at 626 nm.

EXAMPLE 1

Figure 4:
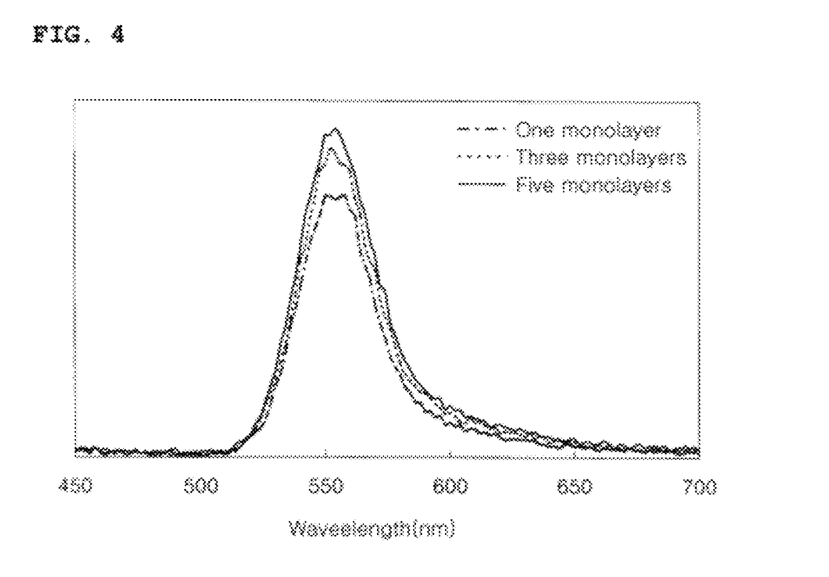
FIG. 4 shows photoluminescence spectra of a monolayer of nanocrystals and multilayers of nanocrystals, prepared in Example 1 of the present invention, according to increasing number (3 and 5) of the monolayers.

Preparation of Multilayer of CdSeS Nanocrystals Surface-Coordinated by Photosensitive Compound After the toluene dispersion of CdSeS nanocrystals (1 wt %) prepared in Preparative Example 1 was dropped onto a glass substrate cleaned with isopropyl alcohol (IPA), spin coating was performed at 2,000 rpm for 30 seconds. The coated glass substrate was heated on a heating plate at 50° C. to form a monolayer of the nanocrystals. The monolayer was placed in a UV exposure system at an effective wavelength of 200~300 nm, and then UV light (800 W) was irradiated to the monolayer for about 300 seconds. The toluene dispersion of nanocrystals was dropped onto the UV-exposed monolayer, which was then spin-coated, dried and exposed to UV light under the same conditions as the previous formation procedure of the monolayer of nanocrystals. Thereafter, this procedure was repeated four times to prepare a multilayer (5-layer) of nanocrystals. FIG. 4 shows photoluminescence spectra of the multilayers of nanocrystals according to increasing number of the monolayers. As shown in FIG. 4, one luminescence peak in all the photoluminescence spectra was observed around 550 nm, and the luminescence intensity increased with increasing number of the monolayers. Further, the luminescence peak had a full width at half maximum ("FWHM") of approximately 36 nm.

EXAMPLE 2

Fabrication of Electroluminescence Device Comprising Multilayer of Nanocrystals-Polymer as Luminescent Layer An ITO-patterned glass substrate was sequentially washed with a neutral detergent, deionized water, acetone and isopropyl alcohol, and was then subjected to UV-ozone treatment. Poly(9,9'-dioctylfluorene-co-N-(4-butylphenyl) diphenylamine (TFB) was spin-coated on the substrate to form a hole transport layer having a thickness of 50 nm, and then baked. The toluene solution of CdSeS nanocrystals (1 wt %) prepared in Preparative Example 1 was spin-coated on the hole transport layer and dried to form a monolayer having a thickness of about 5 nm. After the monolayer was placed in a UV exposure system at an effective wavelength of 200~300 nm, UV (800 W) light was irradiated thereto for about 200 seconds. A solution of TFB was spin-coated on the exposed monolayer, and baked to obtain a polymer monolayer. The CdSeS nanocrystals were spin-coated on the polymer monolayer to prepare a multilayer of nanocrytals-polymer as a luminescent layer. (3-4-Biphenylyl)-4-phenyl-5-(4-tert-butylphenyl)-1,2,4-triazole (TAZ) was deposited on the luminescent layer to form a hole blocking layer, and then tris(8-hydroxyquinoline)-aluminum (Alq3) was deposited thereon to form an electron transport layer having a thickness of about 30 nm. LiF and aluminum were sequentially deposited on the electron transport layer to thicknesses of 1 nm and 200 nm, respectively, to fabricate an organic-inorganic hybrid electroluminescence device.

One luminescence peak in the electroluminescence spectrum of the organic-inorganic hybrid electroluminescence device was observed around 550 nm, and the FWHM was approximately 90 nm. In addition, the intensity of the peak was 73 Cd/m$^2$ and the luminescent efficiency was 0.32 Cd/A.

Figure 5:
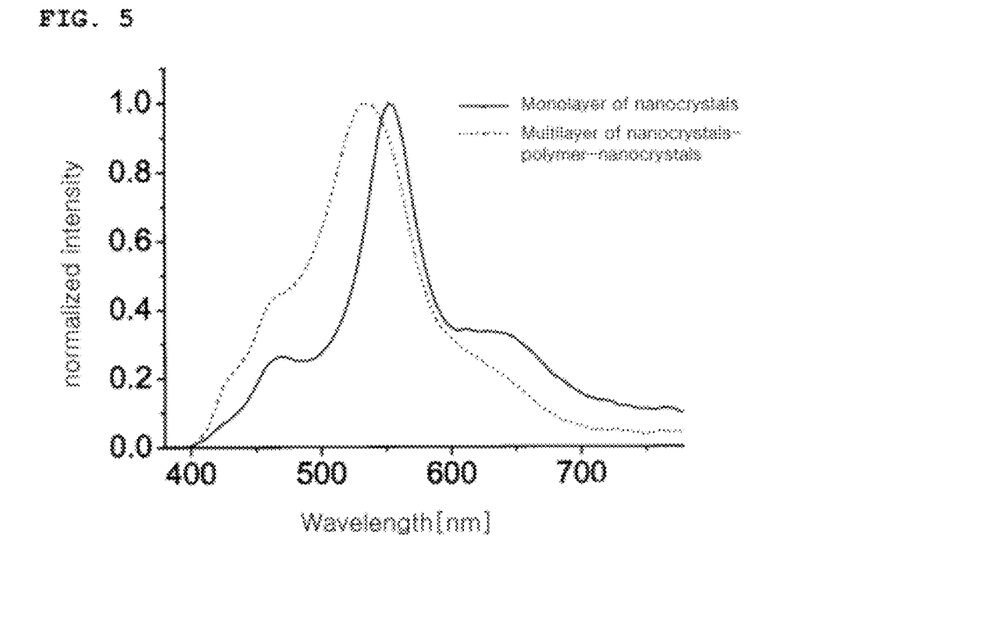
FIG. 5 shows electroluminescence spectra of an organic-inorganic hybrid electroluminescence device using a multilayer of nanocrystals-polymer as a luminescent layer, fabricated in Example 2 of the present invention, and an organic-inorganic hybrid electroluminescence device using a monolayer of nanocrystals as a luminescent layer.
Figure 6:
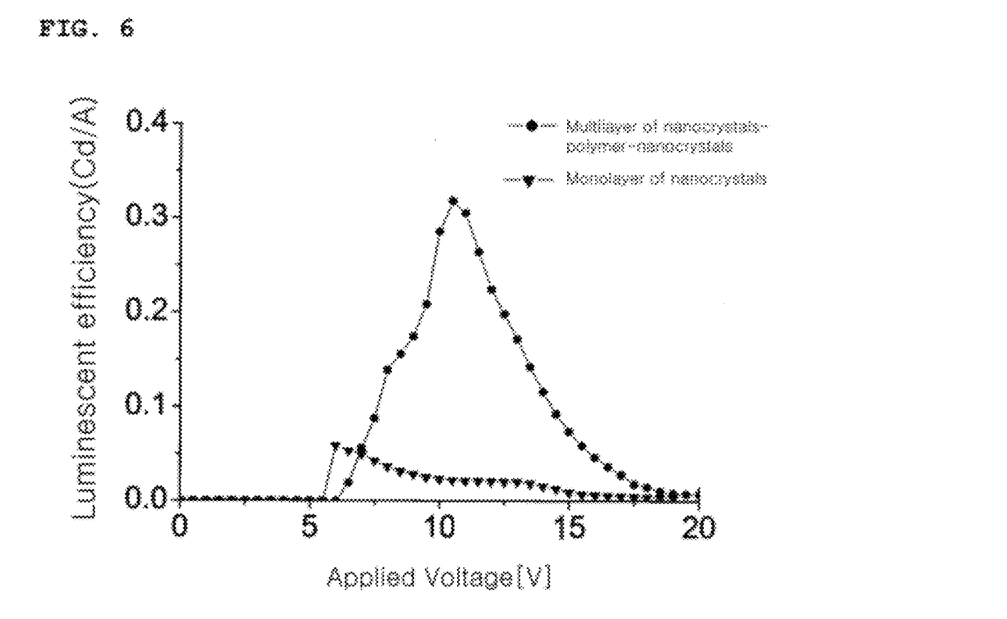
FIG. 6 is a graph showing the luminescent efficiency of an organic-inorganic hybrid electroluminescence device using a multilayer of nanocrystals-polymer as a luminescent layer, fabricated in Example 2 of the present invention, and an organic-inorganic hybrid electroluminescence device using a monolayer of nanocrystals as a luminescent layer.

FIG. 5 shows electroluminescence spectra of the organic-inorganic hybrid electroluminescence device using the multilayer of nanocrystals-polymer (TFB)-nanocrystals as a luminescent layer, fabricated in Example 2, and an organic-inorganic hybrid electroluminescence device using a monolayer of nanocrystals as a luminescent layer. FIG. 6 is a graph showing the luminescent efficiency of the organic-inorganic hybrid electroluminescence device using the multilayer of nanocrystals-polymer (TFB)-nanocrystals as a luminescent layer, fabricated in Example 2, and an organic-inorganic hybrid electroluminescence device using a monolayer of nanocrystals as a luminescent layer.

As shown in FIG. 5, the electroluminescence spectrum of the organic-inorganic hybrid electroluminescence device using the multilayer of nanocrystals-polymer-nanocrystals as a luminescent layer is similar to that of the organic-inorganic hybrid electroluminescence device using a monolayer of nanocrystals as a luminescent layer. However, it can be confirmed from FIG. 6 that the luminescent efficiency of the organic-inorganic hybrid electroluminescence device using the multilayer of nanocrystals-polymer-nanocrystals as a luminescent layer is 5.5 times that of the organic-inorganic hybrid electroluminescence device using a monolayer of nanocrystals as a luminescent layer.

EXAMPLE 3

Fabrication of Semiconductor Nanocrystal-Polymer Composite Thin Film

The green semiconductor nanocrystals having a light emission wavelength of 533 nm, synthesized in Preparative Example 2, were dissolved in 578 mL of toluene such that an optical density (OD), in which an absorbance of a diluted (100×) solution at the first absorption maximum wavelength in a UV-Vis absorbance spectrum, was adjusted to 0.10, to prepare a green semiconductor nanocrystal dispersion.

The red semiconductor nanocrystals having a light emission wavelength of 626 nm, synthesized in Preparative Example 3, were dissolved in 240 mL of toluene such that an optical density (OD) was adjusted to 0.04 to prepare a red semiconductor nanocrystal dispersion.

Ethanol was added to a mixture of the green semiconductor nanocrystal dispersion and the red semiconductor nanocrystal dispersion, and the resulting mixture was then centrifuged. After the obtained precipitates were separated from the mixture by decanting the supernatant, and the precipitates were dispersed in 4 kg of isobornyl acrylate (produced by Sartomer Corp.).

0.2 kg of 1-hydroxy-cyclohexyl-phenyl-ketone and 0.1 kg of diphenyl (2,4,6-trimethylbenzoyl)-phosphine oxide) as photo-initiators were dissolved in 3.2 kg of trimcyclodecane dimethanol diacrylate (A-DCP, produced by Shin-nakamura Corp.) and 0.8 kg of trimethylol propane triacrylate (Aldrich), and a urethane acrylate oligomer (EB270, Daicel Corp.) was mixed therewith, followed by stirring. The resulting mixture was mixed with the green semiconductor nanocrystal dispersion and the red semiconductor nanocrystal dispersion to prepare a photocurable composition.

Figure 8:
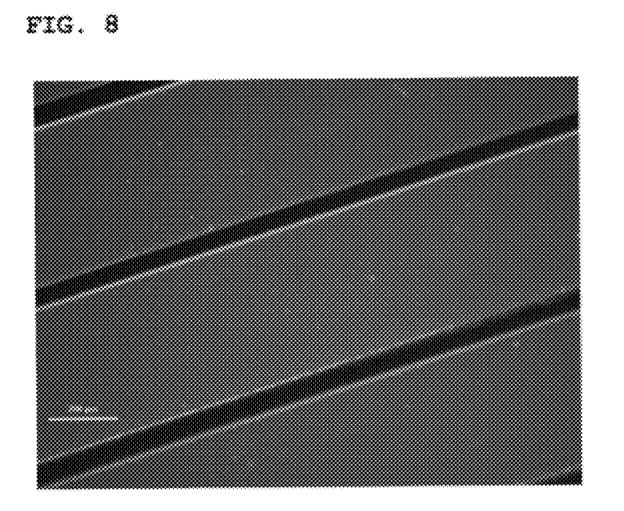
FIG. 8 is a fluorescence microscopy image illustrating a nanocrystal-polymer composite thin film having a predetermined pattern obtained in Example 2 of the present invention.

The photocurable composition was applied to a PET substrate and treated with a mold having a roughness pattern (w: 440 mm, h: 45 mm, gap: 60 mm). The mold was separated and removed, and UV was irradiated at 1000 mJ/cm$^2$ to the photocurable composition coating layer to fabricate a semiconductor nanocrystal-polymer composite thin film. The fluorescence micrograph image of the monolayer-shaped nanocrystal-polymer composite thin film having a predetermined pattern is shown in FIG. 8.

Figure 9:
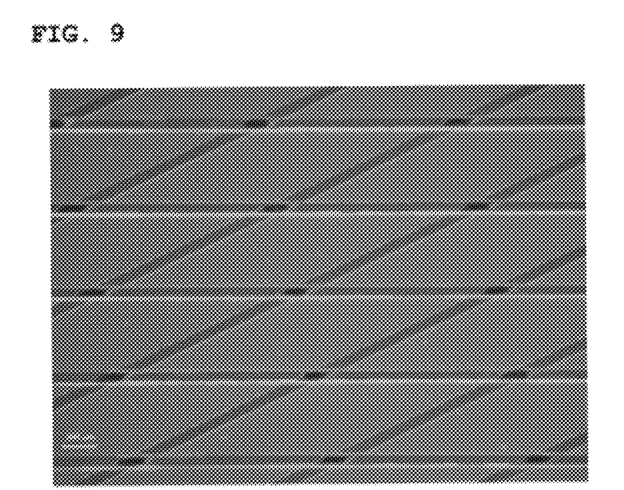
FIG. 9 is a fluorescence microscopy image illustrating a thin film obtained by laminating a plurality of nanocrystal-polymer composite thin films having a predetermined pattern obtained in Example 2 of the present invention at a predetermined angle.

The formation of the photocurable composition coating layer and the exposure were repeated to fabricate another nanocrystal-polymer composite thin film, the fabricated two layers of thin films were laminated such that the patterns overlapped at an angle of 25 degrees to fabricate a multilayer thin film. The fluorescence micrograph image of multilayer semiconductor nanocrystal-polymer composite thin film having the predetermined pattern thus obtained is shown in FIG. 9.

EXAMPLE 4

Display Device Comprising Semiconductor Nanocrystal-Polymer Composite Thin Film

Figure 10:
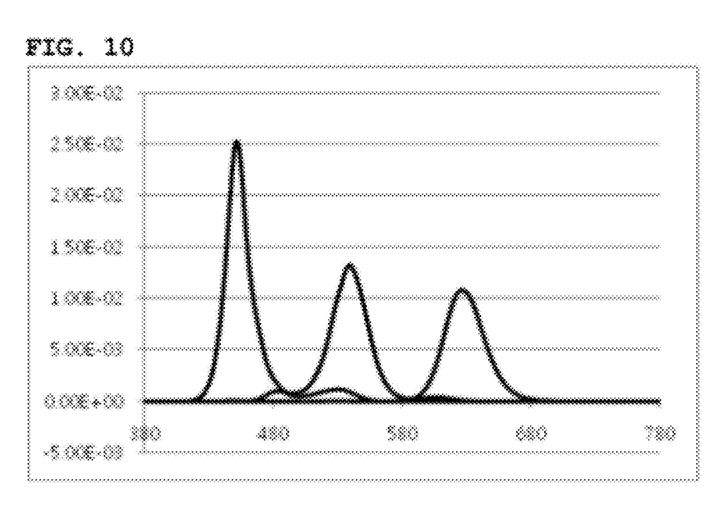
FIG. 10 is a luminescence spectrum illustrating a liquid crystal display device using a nanocrystal-polymer composite thin film obtained in Example 3 of the present invention.

The semiconductor nanocrystal-polymer composite thin film fabricated in Example 3 was inserted between a light guide plate and a prism sheet in a backlight using a 449 nm blue LED as a light source, to manufacture a 60 inch liquid crystal display device. Spectra corresponding to white light realized in the liquid crystal display device and blue, green and red constituting white light are shown in FIG. 10.

When the semiconductor nanocrystal-polymer composite thin film is used as a thin film for light conversion, a liquid crystal display device having an area ratio of 99%, as compared to NTSC (standard color regions), and exhibiting high color reproduction as an sRGB matching ratio of 100% can be realized.

As apparent from the foregoing, the use of the multilayer of nanocrystals or the multilayer of nanocrystals-polymer as a luminescent layer enables fabrication of an organic-inorganic hybrid electroluminescence device having enhanced luminescent efficiency and luminescence intensity. Particularly, the electrical properties of the electroluminescence device using the multilayer of nanocrystals-polymer as a luminescent layer can be controlled by the properties of the selected polymer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a nanocrystal-polymer thin film comprising:
   (i) preparing a photocurable composition comprising a photocurable compound and a semiconductor nanocrystal surface-coordinated with a photosensitive compound; wherein the photocurable compound is selected from a group consisting of allyloxylated cyclohexyl diacrylate, bis(acryloxy ethyl)hydroxyl isocyanurate, bis(acryloxy neopentylglycol) adipate, bisphenol A diacrylate, bisphenyl A dimethacrylate, 1,4-butanediol diacrylate, 1,4-butanediol dimethacrylate, 1,3-butyleneglycol diacrylate, 1,3-butyleneglycol dimethacrylate, dicyclopentanyl diacrylate, diethyleneglycol dimethacrylate, dipentaerythirol hexaacrylate, dipentaerythirol monohydroxy pentacrylate, ditrimethylolpropane tetraacrylate, ethyleneglycol dimethacrylate, glycerol methacrylate, 1,6-hexanediol diacrylate, neopentyiglycol dimethacrylate, neopentyiglycol hydroxypivalate diacrylate, pentaerythritol triacrylate, pentaerythritol tetraacrylate, phosphoric acid dimethacrylate, polypropyleneglycol diacrylate, tetraethyleneglycol diacrylate, tetrabromobisphenol A diacrylate, triethyleneglycol divinylether, triglycerol diacrylate, trimethyloipropane triacrylate, tripropyleneglycol diacrylate, tris(acryloxyethyl)isocyanurate, phosphoric acid triacrylate, phosphoric acid diacrylate, acrylic acid propargyl ester, vinyl terminated potydimethylsiloxane, vinyl terminated diphenylsiloxane-dimethylsiloxane copolymer, vinyl terminated polyphenylmethylsiloxane, vinyl terminated trifluoromethylsiloxane-dimethylsiloxane copolymer, vinyl terminated diethylsiloxane-dimethylsiloxane copolymer, vinylmethylsiloxane, monomethacryloyloxypropyl terminated polydimethyl siloxane, monovinyl terminated polydimethyl siloxane and monoallyl-mono trimethylsiloxy terminated polyethylene oxide;
(ii) applying the photocurable composition to a substrate to form a photocurable composition coating layer;
(iii) treating the photocurable composition coating layer with a mold having a predetermined pattern to form the predetermined pattern on a surface of the photocurable composition coating layer; and
(iv) exposing the photocurable composition coating layer to a light.

2. The method according to claim 1, wherein the photocurable composition further comprises a solvent, a binder polymer or a photoinitiator.

3. The method according to claim 1, wherein photosensitive compound coordinating the surface of the nanocrystal is a compound in which a photoreactive functional group such as a carbon-carbon double bond or an acrylic group is selectively bonded to a linker such as cyanide, SH, amine, a carboxyl group and a phosphonic acid group through an alkylene group, an amide group, a phenylene group, a biphenylene group, an ester group, or an ether group.

4. The method according to claim 1, wherein the method comprises:
repeating the application of the photocurable composition to a substrate to form a photocurable composition coating layer and the exposure of the photocurable composition coating layer, two or more times, to form two or more layers of semiconductor nanocrystal-polymer composite thin films.

5. The method according to claim 4, further comprising:
laminating the two or more layers of semiconductor nanocrystal-polymer composite thin films.

6. The method according to claim 5, wherein the lamination of the two or more layers of semiconductor nanocrystal-polymer composite thin films is carried out such that patterns of the thin films overlap at a predetermined angle.

7. The method according to claim 4, wherein the semiconductor nanocrystals comprised in the two or more layers of semiconductor nanocrystal-polymer composite thin films have different sizes.

8. The method according to claim 1, wherein the nanocrystals are at least one selected from the group consisting of metal nanocrystals, Group II-VI compound semiconductor nanocrystals, Group III-V compound semiconductor nanocrystals, Group IV-VI compound semiconductor nanocrystals and mixtures thereof.

9. The method according to claim 8, wherein, when the nanocrystals are a compound of two or more selected from the group consisting of metal nanocrystals, Group II-VI compound semiconductor nanocrystals, Group IV-VI compound semiconductor nanocrystals, and Group III-V compound semiconductor nanocrystals, the nanocrystals are present in the form of a simple mixture, or a fused crystal in which at least two compound crystals are partially present in the same crystal structure, or an alloy.

10. The method according to claim 1, wherein the exposure is carried out using a light source having an energy of 100 to 800 W at a wavelength of 200 to 500 nm.

11. The method according to claim 1, wherein the energy for photosensitization treatment upon exposure is 50 mJ/cm$^2$ to 850 mJ/cm$^2$.

12. The method according to claim 1, wherein the mold has a surface with the predetermined pattern,
wherein the predetermined pattern includes a recessed and/or protruded shape, and
wherein the predetermined pattern has a rectangular shape, a triangular shape, a trapezoidal shape, a cone shape, a prism shape, a pyramid shape or a combination thereof.

13. The method according to claim 1, wherein the predetermined pattern on the photocurable composition coating layer has a vertical size in a range from about 10 um to about 250 um.

14. The method according to claim 1, wherein the surface of the photocurable composition coating layer comprises a patterned area and a non-patterned area, and
wherein a ratio of the patterned area to the non-patterned area is in a range from about 0.002 to about 2.

* * * * *